United States Patent
Tanaka et al.

(10) Patent No.: US 6,320,888 B1
(45) Date of Patent: Nov. 20, 2001

(54) FREQUENCY STABILIZED LASER AND METHOD FOR PREPARING THEREOF

(75) Inventors: Takuya Tanaka; Hiroshi Takahashi; Akimasa Kaneko; Akira Himeno; Yasuyuki Inoue, all of Tokyo (JP)

(73) Assignee: Nippon Telegraph & Telephone Corporation, Tokyo (JP)

( * ) Notice: Subject to any disclaimer, the term of this patent is extended or adjusted under 35 U.S.C. 154(b) by 0 days.

(21) Appl. No.: 09/156,500

(22) Filed: Sep. 18, 1998

(30) Foreign Application Priority Data

Sep. 19, 1997 (JP) ................................... 9-255122

(51) Int. Cl.[7] ..................................................... H01S 5/14
(52) U.S. Cl. .................. 372/32; 372/34; 372/50; 372/102
(58) Field of Search ................. 372/32, 34, 50, 372/92, 36, 35, 102

(56) References Cited

U.S. PATENT DOCUMENTS 4,583,227 * 4/1986 Kirkby .................................. 372/32

FOREIGN PATENT DOCUMENTS

| | | |
|---|---|---|
| 56-150887 | 11/1981 | (JP) . |
| 06230237 | 8/1994 | (JP) . |
| 7-140311 | 6/1995 | (JP) . |
| 10242591 | 9/1998 | (JP) . |

OTHER PUBLICATIONS

"Integrated external cavity laser composed of spot–size converted LD and UV written grating in silica waveguide on Si", Tanaka et al., Electron Letters, vol. 32, No. 13, pp. 1202–1203 Jun. 1996.

"4 wavelength hybrid laser array composed of spot–size converter integrated LD and UV written grating in silica waveguide on Si" Tanaka et al. Presentations at the 1997 Congress of the Institute of Electronics, Information and Communication Engineers, C–3–160, p. 345. (No month).

"Temperature compensated coupled cavity diode laser" Tada et al., Optical and Quantum Electronics 16 (1984) pp. 463–469 (No month).

"A new configuration for a hybrid integrated external cavity laser without temperature dependent mode hopping," Tanaka et al. Third Opto–electronics and Communications Conference (OECC '98) Technical Digest, Jul. 1998, Makuhari Messe, 16B4–2, pp. 474–475.

Athermal silica–based arrayed–waveguide grating (AWG) multiplexer, Inoue et al. NTT Opto–electronics Laboratories, Sep. 22–25, 1997, pp. 33–36.

"Integrated external cavity laser composed of spot–size converter integrated LD and UV written grating in silica waveguide on Si" Tanaka et al., 1996, p. 303 and Abstract (No month).

\* cited by examiner

*Primary Examiner*—James W. Davie
(74) *Attorney, Agent, or Firm*—Venable; Robert J. Frank

(57) ABSTRACT

A frequency stabilized laser using an integrated external cavity, comprising a semiconductor laser diode and an optical waveguide installed on the same substrate, and having an optically induced grating formed in the optical waveguide suppresses mode hopping due to a temperature change to stabilize the oscillation frequencies of the laser. A material having a refractive index temperature coefficient opposite in sign to the refractive index temperature coefficient of the semiconductor laser diode is installed on that portion of the optical waveguide between the semiconductor laser diode and the optically induced grating which has been formed by removing an upper cladding and a core, or removing the upper cladding, the core, and a lower cladding.

13 Claims, 14 Drawing Sheets

FIG. 3A Si ETCHING
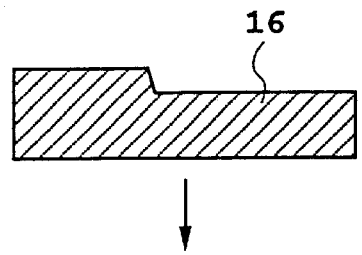
FIG. 3B DEPOSITION OF SILICA-BASED WAVEGUIDE
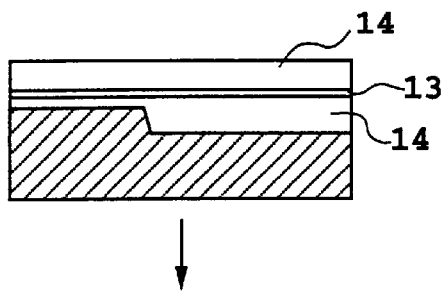
FIG. 3C FORMATION OF Si TERRACE
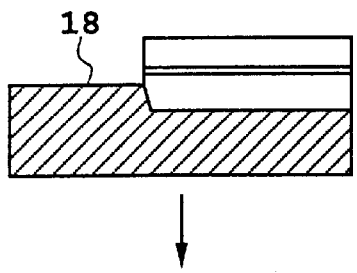
FIG. 3D PREPARATION OF SOLDER PATTERN
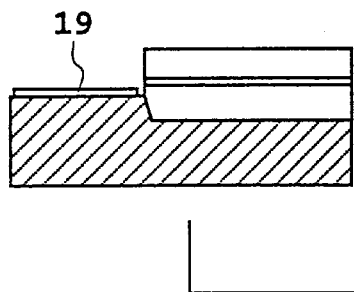
FIG. 3E FORMATION OF GRATING
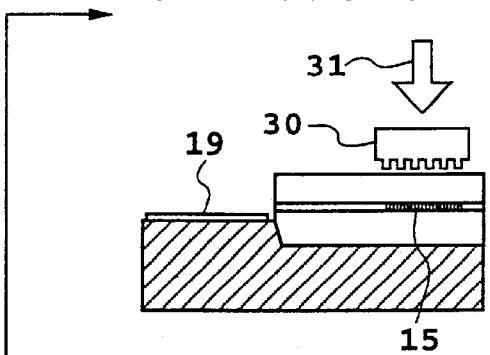
FIG. 3F FORMATION OF GROOVE
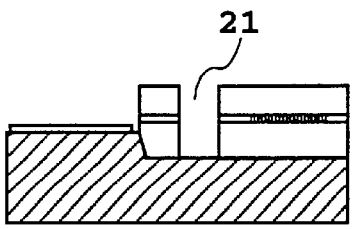
FIG. 3G INSTALLATION OF LD
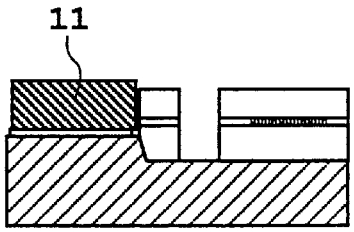
FIG. 3H FILLING OF TEMPERATURE COEFFICIENT ADJUSTING MATERIAL
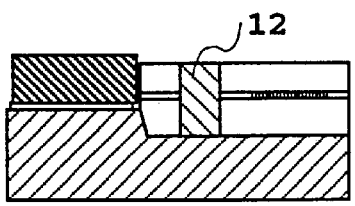

FIG. 10A Si ETCHING
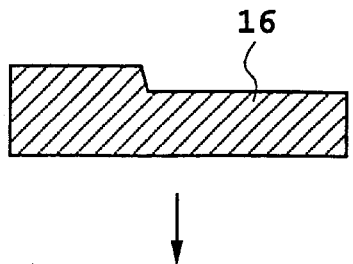
FIG. 10B DEPOSITION OF SILICA-BASED WAVEGUIDE
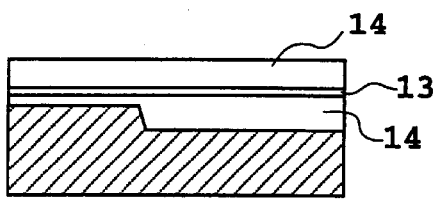
FIG. 10C FORMATION OF Si TERRACE AND GROOVES
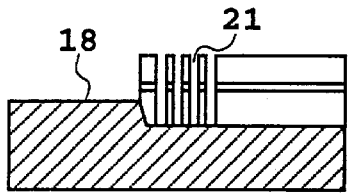
FIG. 10D PREPARATION OF SOLDER PATTERN
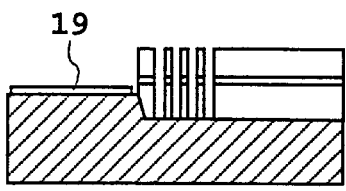
FIG. 10E FORMATION OF GRATING
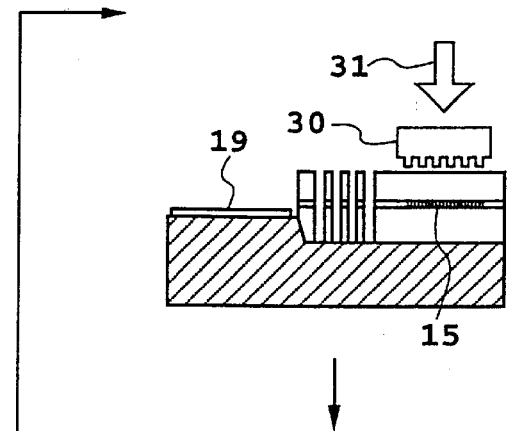
FIG. 10F INSTALLATION OF LD
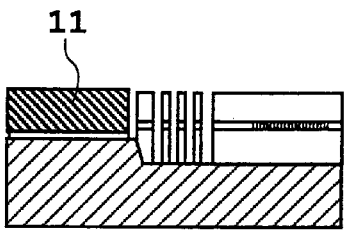
FIG. 10G FILLING OF TEMPERATURE COEFFICIENT ADJUSTING MATERIAL
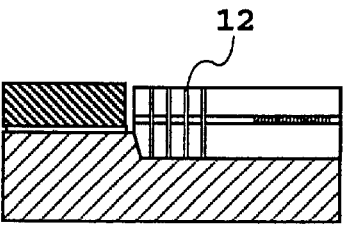

FREQUENCY STABILIZED LASER AND METHOD FOR PREPARING THEREOF

This application is based on patent application Ser. No. 255,122/1997 filed Sep. 19, 1997 in Japan, the content of which is incorporated hereinto by reference.

BACKGROUND OF THE INVENTION

1. Field of the Invention

The present invention relates to the structure of a frequency stabilized laser with mode hopping suppressed in an external cavity type frequency stabilized laser composed of an optically induced grating in an optical waveguide and a semiconductor LD (laser diode).

2. Description of the Related Art

A laser composed of an optically induced grating in a silica glass waveguide and a semiconductor LD is expected to find various uses as light sources for optical communication, optical information processing, optical measurement, and spectroscopy because of the following features: (1) It performs single-mode oscillation by utilizing the frequency selectivity of the grating. (2) Its temperature coefficient is smaller than that of a semiconductor laser. (3) Its oscillation frequencies can be controlled easily. (T. Tanaka, et al., Electron. Lett., vol. 32, No. 13, 1202 (1996); and Tanaka, et al., Presentations at the 1997 Congress of the Institute of Electronics, Information and Communication Engineers, C-3-160). The technique for fabrication of an optically induced grating was invented by Kenneth O. Hill, et al. (Japanese Patent Application Laying-open No. 7-140311(1995)). The optically induced grating will be referred to hereinbelow as a grating for simplification.

FIG. 13 is a schematic perspective view of a frequency stabilized laser produced by an earlier technology. In FIG. 13, the reference numeral 11 designates a semiconductor LD, 13 a core of a silica-based waveguide, and 14 a cladding of the silica-based waveguide. The reference numeral 15 denotes a grating, 16 an Si substrate, and 18 a portion, called a silicon terrace, which has been formed by removing silica glass for installation of the semiconductor LD.

The oscillation modes of the frequency stabilized laser composed of the grating in the silica-based waveguide and the semiconductor LD will be described. When an injection current is flowed into the semiconductor LD to cause light emission, only light of frequencies corresponding to the reflection spectrum of the grating is reflected by the grating. Thus, oscillation originates from a laser cavity which is a zone from the rear facet of the semiconductor LD to the grating. On the output endface of the semiconductor LD, an antireflection film to the interface with air is provided so that there will be no external feedback to the semiconductor LD except from the grating and the rear facet of the semiconductor LD. Also, the LD-side end face of the silica-based waveguide has a core-adjoining portion inclined with respect to a direction perpendicular to the optical axis of the core (see Japanese Patent Application Laying-open No. 6-230237 (1994)). Generally, the bandwidth of the reflection frequencies of a grating is about 50 GHz. On the other hand, the length of a laser cavity is about 0.5 cm. Thus, the frequency spacing of longitudinal modes is about 20 GHz. Since longitudinal modes exist with 20 GHz spacing in the 50 GHz bandwidth, about 3. longitudinal modes can be present. Of these longitudinal modes, only the one closest to the reflection center frequency of the grating is selected for oscillation. Generally, the reflectance of the grating is 40 to 99%, and the optical coupling loss between the semiconductor LD and the silica-based waveguide is about 4 dB±1.5 dB.

With the conventional frequency stabilized laser, however, the frequency of the longitudinal mode selected depends on temperature, causing a phenomenon in which the oscillating mode changes with a temperature change (to be called mode hopping). The reason will be explained as follows:

The temperature coefficient of the longitudinal modes of a conventional frequency stabilized laser is expressed in an approximated manner by the equation (1)

$$m = \frac{m_{LD} n_{LD} L_{LD} + m_{WG} n_{WG} L_{WG}}{n_{LD} L_{LD} + n_{WG} L_{WG}} \tag{1}$$

where $m_{LD}$ and $m_{WG}$ are the temperature coefficient of the resonance frequencies of a resonator of a semiconductor LD, and the temperature coefficient of the resonance frequencies of a cavity prepared from a silica-based waveguide, respectively, $n_{LD}$ and $n_{WG}$ are the equivalent index of a guide layer of the semiconductor LD, and the equivalent index of the silica-based waveguide, respectively, and $L_{LD}$ and $L_{WG}$ are the cavity length of the semiconductor LD, and the silica-based waveguide length from the exit end of the semiconductor LD to the center of the grating, respectively. The grating is written into the silica-based waveguide, and the temperature coefficient of the reflection center frequency is equal to the temperature coefficient $m_{WG}$ of the silica-based waveguide. Since $m_{LD} \approx 10\, m_{WG}$, the magnitude of the temperature coefficient m of the longitudinal modes is larger than the temperature coefficient $m_{WG}$ of the reflection center frequency of the grating.

That is, the temperature coefficient of the longitudinal modes does not equal the temperature coefficient of the reflection center frequency of the grating.

FIG. 14 is an explanatory drawing for mode hopping. Assume that oscillation is occurring in the Nth longitudinal mode. As a result of a change in temperature, the longitudinal mode closest to the reflection center frequency of the grating shifts to the (N+1)th, where oscillation takes place. That is, mode hopping occurs. In an example described in the paper T. Tanaka, et al., Electron. Lett., Vol. 32, No. 13, 1202 (1996), mode hopping occurred each time the temperature changed by 5° C. Since mode hopping increases the error rate of transmitted signals, realization of a method for suppressing it was desired.

The present invention has been accomplished to solve the above-described problem. Its object is to provide a frequency stabilized laser whose mode hopping due to a temperature change is suppressed by matching the temperature coefficient of longitudinal modes to the temperature coefficient of the reflection center frequency of a grating.

SUMMARY OF THE INVENTION

According to an aspect of the present invention for attaining the foregoing object, there is provided a frequency stabilized laser using an integrated external cavity and comprising a semiconductor laser diode installed on a substrate, an optical waveguide formed on the substrate, and an optically induced grating formed in the optical waveguide; wherein a material having a refractive index temperature coefficient opposite in sign to the refractive index temperature coefficient of the semiconductor laser diode is installed on a portion of the optical waveguide between the semiconductor laser diode and the optically induced grating, the portion being formed by removing an upper cladding and a core, or removing the upper cladding, the core, and a lower cladding.

Preferably, the optical waveguide is composed of silica glass. The portion formed by removing the upper cladding and the core, or removing the upper cladding, the core, and the lower cladding preferably crosses the waveguide at an angle of 80 to 90 degrees, more preferably 80 to 87 degrees.

Further preferably, the portion formed by removing the upper cladding and the core, or removing the upper cladding, the core, and the lower cladding is composed of a plurality of grooves. It is also preferred that a groove connecting the plurality of grooves together is present, and a liquid reservoir is connected to the connecting groove.

Preferably, the absolute value of the refractive index temperature coefficient of the material having the refractive index temperature coefficient opposite in sign to the refractive index temperature coefficient of the semiconductor laser diode is $1 \times 10^{-4}$ (1/K) or more, where K is the absolute temperature on the Kelvin scale.

The present invention also provides a method for producing the aforementioned frequency stabilized laser, including the steps of:

(a) obtaining a silicon substrate by etching;
(b) forming a silica-based waveguide on the silicon substrate by flame hydrolysis deposition and photolithography;
(c) performing photolithography and reactive ion etching by use of a photomask pattern-designed for forming a plurality of fine grooves to be filled with a material having a refractive index temperature coefficient opposite in sign to the refractive index temperature coefficient of a semiconductor LD, a connecting groove, and a liquid reservoir, to etch the silica layer partly, thereby forming a silicon terrace for placing the semiconductor LD thereon, and simultaneously forming the plurality of fine grooves, the connecting groove, and the liquid reservoir;
(d) forming a solder pattern on the silicon terrace;
(e) irradiating the waveguide with light from an excimer laser or the second harmonic of an argon laser through a phase mask to prepare a grating;
(f) placing the semiconductor LD on the silicon terrace; and
(g) filling the material having the refractive index temperature coefficient opposite in sign to the refractive index temperature coefficient of the semiconductor LD through the liquid reservoir and the connecting groove.

As described above, the present invention fills the temperature coefficient adjusting material into the grooves, i.e., the portion formed by removing the upper cladding and the core, or removing the upper cladding, the core and the lower cladding. By adopting this simple method, the invention can bring the temperature coefficient of the longitudinal modes into agreement with the temperature coefficient of the reflection center frequency of the grating, and easily suppress mode hopping which has been problematical. Thus, the use of the invention makes it possible to realize a stable, minimally temperature-dependent, single mode laser at a low cost. This laser can be expected to exhibit marked effects in fields using lasers, such as optical communication.

The above and other objects, effects, features and advantages of the present invention will become more apparent from the following description of the embodiments thereof taken in conjunction with the accompanying drawings.

BRIEF DESCRIPTION OF THE DRAWINGS

FIGS. 3A–3H are schematic views illustrating a fabrication process for a wavelength stabilized laser of the first embodiment;

FIGS. 10A–10G are schematic views illustrating a fabrication process for a frequency stabilized laser of the fourth embodiment;

DETAILED DESCRIPTION OF THE PREFERRED EMBODIMENTS

Figure 1:
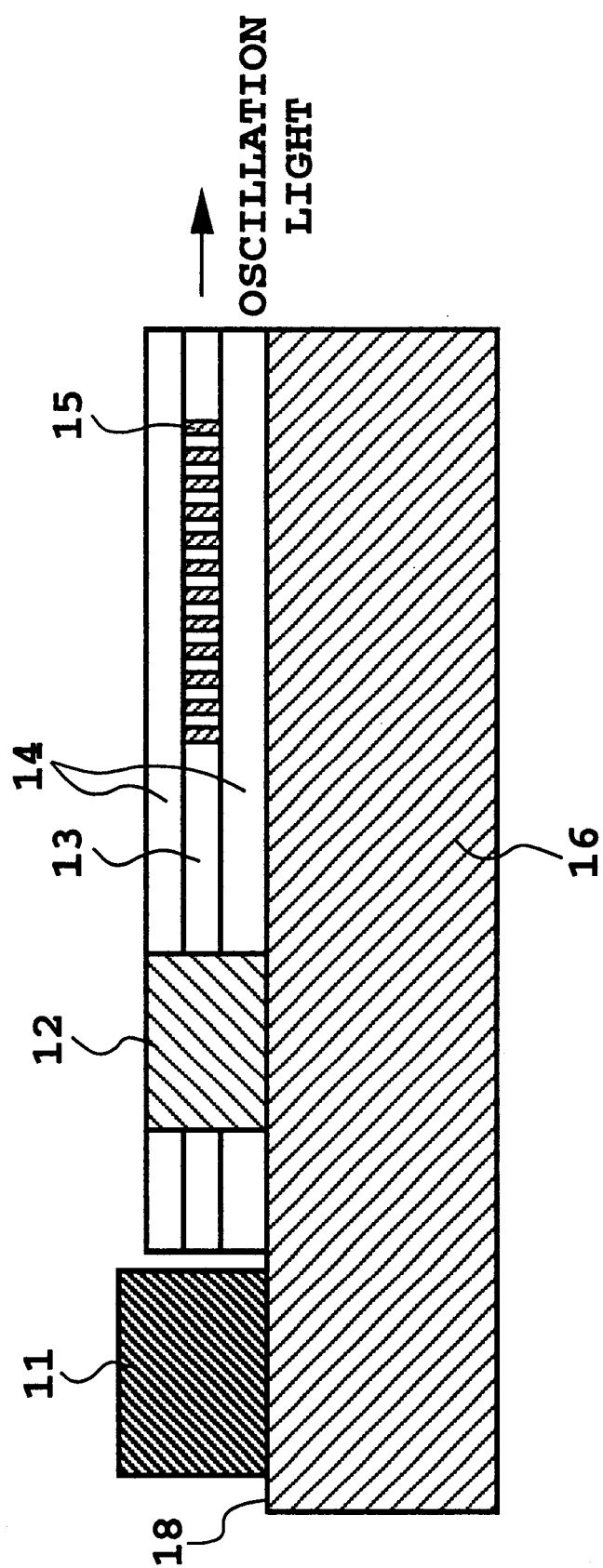
FIG. 1 is a schematic sectional view showing a structure according to a first embodiment of the present invention.

The frequency stabilized laser of the present invention has a semiconductor laser diode installed on a substrate, an optical waveguide formed on the substrate, and an optically induced grating formed in the optical waveguide; wherein a material having a refractive index temperature coefficient opposite in sign to the refractive index temperature coefficient of the semiconductor laser diode is installed on a portion of the optical waveguide between the semiconductor laser diode and the optically induced grating, the portion being formed by removing an upper cladding and a core, or removing the upper cladding, the core, and a lower cladding.

The foregoing constitution of the invention can suppress mode hopping. In detail, the material having a refractive index temperature coefficient of opposite sign to the sign of the refractive index temperature coefficient of the semiconductor LD is installed between the semiconductor LD and the grating. This can counteract a change in the optical path length of the semiconductor LD due to a temperature change in the laser cavity of the frequency stabilized laser. As a result, the temperature coefficient of the resonance frequencies of the laser cavity can be reduced. Hence, the temperature coefficient of longitudinal modes can be matched to the temperature coefficient of the reflection center frequency of the grating by appropriately designing the size of the region for the installation of the material having a refractive index temperature coefficient of the sign opposite to the sign of the refractive index temperature coefficient of the semiconductor LD.

This material whose refractive index temperature coefficient is of the sign opposite to the sign of the refractive index temperature coefficient of the semiconductor LD will be called a temperature coefficient adjusting material hereinbelow.

EXAMPLES

Embodiments of the present invention will now be described in detail by reference to the accompanying drawings. In all drawings for illustrating the embodiments, members having the same functions are assigned the same reference numerals or symbols, and their overlapping explanations will be omitted.

Example 1

Example 1 takes as an example a frequency stabilized laser whose optical waveguide is composed of silica glass.

Figure 2:
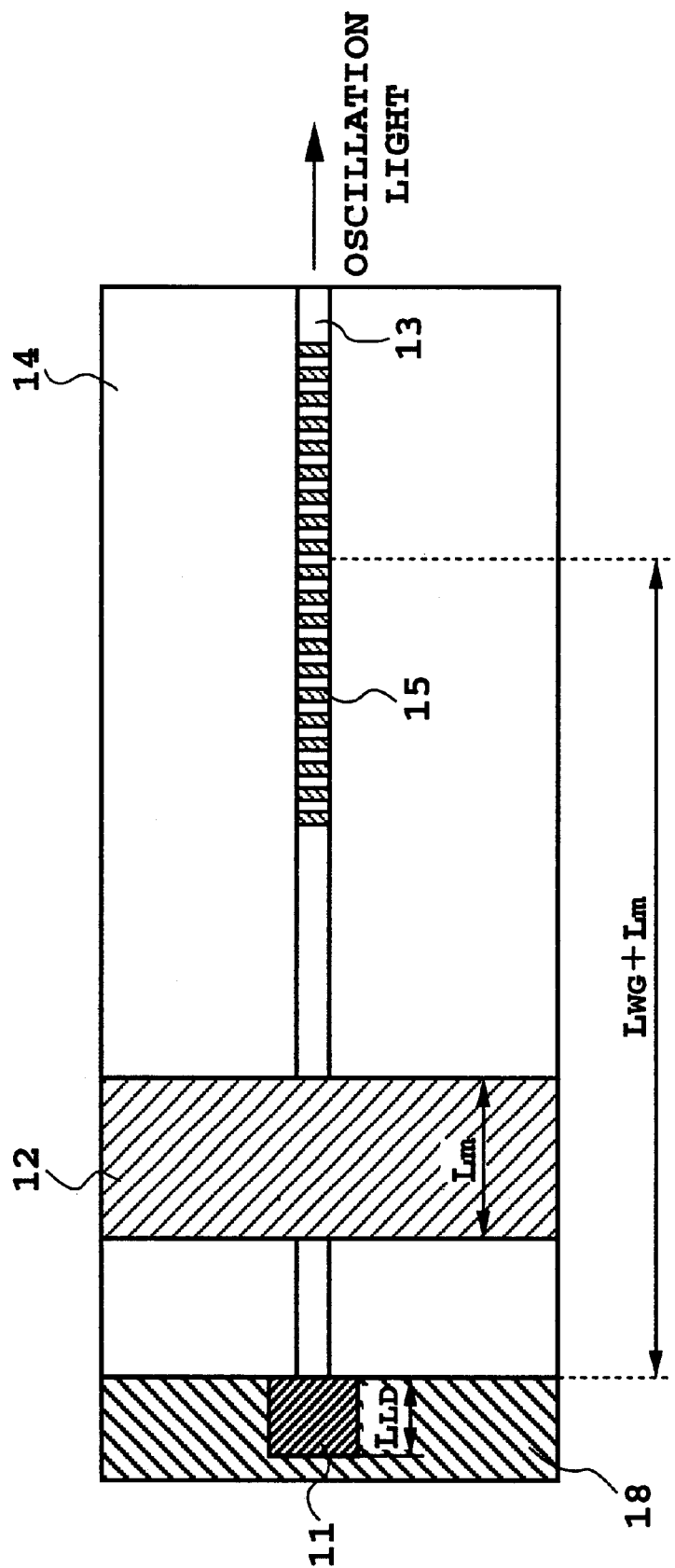
FIG. 2 is a schematic plan view showing the structure of the first embodiment.

FIGS. 1 and 2 show a first embodiment of the present invention, with FIG. 1 being a sectional view of the laser, and FIG. 2 being a plan view of the laser. The reference numerals 11 designates a semiconductor LD, 12 a temperature coefficient adjusting material installed in a groove provided perpendicularly to the silica-based waveguide, 13 a core of the silica-based waveguide, 14 claddings of the silica-based waveguide, 15 a grating, 16 a silicon substrate, and 18 a silicon terrace.

The oscillation wavelength of the semiconductor LD is 1.55 µm. Thus, the approximate frequency of light from the frequency stabilized laser is expressed by the equation (2):

$$V = 193 \times 10^{12} (Hz) \quad (2)$$

The temperature coefficient, m, of longitudinal modes of the frequency stabilized laser shown in FIGS. 1 and 2 is given in an approximated manner by the equation (3):

$$m = \frac{m_{LD} n_{LD} L_{LD} + m_{WG} n_{WG} L_{WG} + m_m n_m L_m}{n_{LD} L_{LD} + n_{WG} L_{WG} + n_m L_m} \quad (3)$$

where $m_{LD}$, $m_{WG}$ and $m_m$ are the temperature coefficient of the resonance frequencies of a cavity of the semiconductor LD, the temperature coefficient of the resonance frequencies of the silica-based waveguide portion as a cavity, and the temperature coefficient of the resonance frequencies of the temperature coefficient adjusting material, respectively;

$n_{LD}$, $n_{WG}$ and $n_m$ are the equivalent index of the guide layer of the semiconductor LD, the equivalent index of the silica-based waveguide between the semiconductor LD and the grating, and the refractive index of the temperature coefficient adjusting material, respectively, and $L_{LD}$, $L_m$ and $L_{WG}$ are the cavity length of the semiconductor LD, the length of the portion in which the temperature coefficient adjusting material is installed, and the length of the silica-based waveguide portion ranging from the exit end of the semiconductor LD to the center of the grating (excluding the region where the temperature coefficient adjusting material is installed), respectively. The temperature interval, T, for mode hopping is obtained from the equation (4) by dividing the frequency spacing of longitudinal modes by the difference between the temperature coefficient of the grating, i.e., the temperature coefficient $m_{WG}$ of the silica-based waveguide, and the temperature coefficient m of longitudinal modes:

$$T = \left| \frac{c}{2(n_{LD} L_{LD} + n_{WG} L_{WG} + n_m L_m)} \times \frac{1}{m_{WG} - m} \right| \quad (4)$$

where c is the velocity of light c=3.0×10⁸ (m/s).

Calculations will be indicated for obtaining a concrete value of the temperature coefficient $m_{WG}$ of the resonance frequencies of the silica-based waveguide portion, excluding the area where the temperature coefficient adjusting material is installed, in Example 1. Here, the area where the grating is formed, and the area where no grating is formed have the same value of temperature coefficient.

Generally, the temperature coefficient of the resonance frequencies of a resonator prepared from a material having a refractive index, n, and a linear thermal expansion coefficient, α, is known to be expressed by the equation (5) if the photoelastic effect is ignored:

$$\frac{dv}{dT} = -v\left(\frac{1}{n}\frac{dn}{dT} + \alpha\right) \quad (5)$$

The temperature coefficient of refractive index is given by the equation (6), since the material is silica glass:

$$\frac{dn}{dT} = 7.0 \times 10^{-6} (1/K) \quad (6)$$

The linear thermal expansion coefficient of the silica-based waveguide portion will be determined. In the laser of FIG. 1, the total thickness of the silica glass portion of the core 13 and the claddings 14 is about 60 µm, while the thickness of the Si substrate is about 1 mm, a sufficiently large value. Thus, the linear thermal expansion coefficient $\alpha_{WG}$ of the silica-based waveguide portion is expressed as the linear thermal expansion coefficient of the Si substrate (equation (7)):

$$\alpha = \alpha_{WG} = 2.33 \times 10^{-6} (1/K) \quad (7)$$

Hence, the temperature coefficient $m_{WG}$ of the silica-based waveguide portion from the end of the semiconductor LD to the grating is obtained from the equation (8) by substituting the equivalent index of the silica-based waveguide n=$n_{WG}$=1.45 and the equations (2), (6) and (7) into the equation (5).

$$m_{WG} = \frac{dv}{dT} = -1.4 (GHz/K) \quad (8)$$

In accordance with the same calculation procedure, the temperature coefficient of the temperature coefficient adjusting material is obtained.

Silicone is used as the temperature coefficient adjusting material. The refractive index $n_m$ of the silicone is 1.39, and the temperature coefficient of the refractive index is expressed by the equation (9):

$$\frac{dn}{dT} = -3.9 \times 10^{-4} (1/K) \quad (9)$$

The temperature coefficient adjusting material is installed in the groove crossing the core, i.e., a 30 to 60 µm deep groove formed by removing the upper cladding and the core, or the upper cladding, the core and the lower cladding, of the silica-based waveguide. The thickness of the temperature coefficient adjusting material is smaller than the thickness of the Si substrate, 1 mm. The method for formation of the groove will be described later on in the fabrication process. Thus, the linear thermal expansion coefficient αm of the area where the temperature coefficient adjusting material is installed equals the linear thermal expansion coefficient of the Si substrate, and is expressed by the equation (10):

$$\alpha = \alpha = 2.33 \times 10^{-6} \text{ (1/K)} \tag{10}$$

Substitution of the equations (2), (9) and (10) and $n=n_m=1.39$ into the equation (5) gives the temperature coefficient $m_m$ of the resonance frequencies of the area where the temperature coefficient adjusting material is installed, as expressed by the equation (11):

$$m_m = 54 \text{ (GHz/K)} \tag{11}$$

The length $L_{LD}$ of the semiconductor LD is 0.60 mm, the equivalent index $n_{LD}$ of the guide layer of the semiconductor LD is 3.5, and the equivalent index $n_{WG}$ of the silica-based waveguide is 1.45. The length from the LD output endface to the LD-facing end of the grating is 1.5 mm, and the length of the grating is 3.0 mm. Thus, the length $L_{WG}$ of the silica-based waveguide portion (excluding the region where the temperature coefficient adjusting material is installed) from the end of the semiconductor LD to the center of the grating is (3.0–$L_m$) mm. The temperature coefficient of the semiconductor LD is $m_{LD}=-12.9$ (GHz/K). In the design of the first embodiment, therefore, the total length $L_m$ of the region where the temperature coefficient adjusting material is installed was set at 0.30 mm based on the above parameters and the equations (3), (8) and (11) so that the mode hopping temperature interval would be T=140° C.

The frequency stabilized laser of FIGS. 1 and 2 was designed in accordance with the above parameters, and fabricated. The fabrication process is shown in FIGS. 3A–3H. This process comprises the following 8 steps:

(1) Si etching (FIG. 3A):
Form a stepped Si substrate 16 by etching.

(2) Deposition of silica-based waveguide (FIG. 3B):
Form a silica-based waveguide on the Si substrate by flame hydrolysis deposition which utilizes an optical fiber making technique and photolithography which is used for the production of an LSI. The numeral 13 denotes a core of the silica-based waveguide, and 14 denotes claddings of the silica-based waveguide.

(3) Formation of Si terrace (FIG. 3C):
Partly etch the silica layer by photolithography and reactive ion etching to form a semiconductor laser installation portion 18 (Si terrace).

(4) Formation of solder pattern (FIG. 3D):
Form on the Si terrace solder pattern 19 for installation of a semiconductor laser.

(5) Preparation of grating (FIG. 3E):
Irradiate the waveguide with excimer laser light (or the second harmonic of an argon laser) 31 through a phase mask 30 to prepare a grating 15.

(6) Formation of groove (FIG. 3F):
Process the waveguide using a dicing saw to form a 300 μm wide groove 21.

(7) Installation of LD (FIG. 3G):
Set a semiconductor LD 11 in place after it was aligned.

(8) Filling of temperature coefficient adjusting material (FIG. 3H):

Fill the groove 21 with silicone, followed by heating to cure the silicone.

Figure 4:
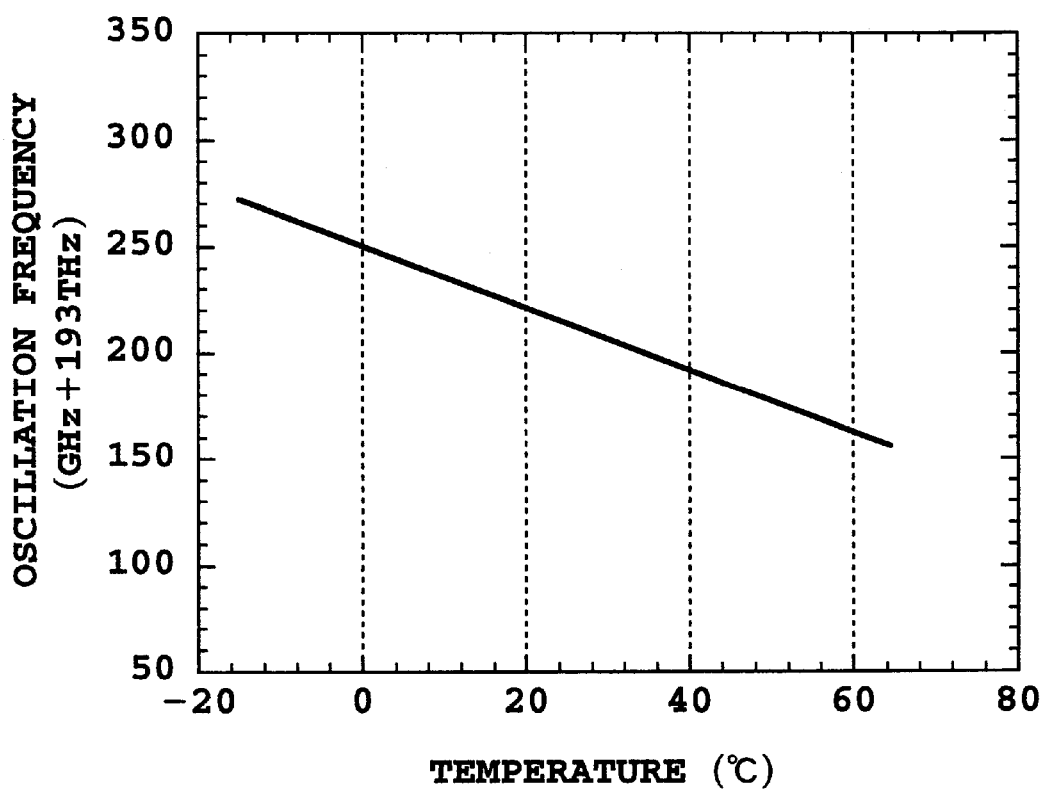
FIG. 4 is a graph showing the results of measurement of the temperature dependence of oscillation frequencies in the first embodiment.

FIG. 4 shows the results of measurement of the temperature dependence of the oscillation frequencies of the frequency stabilized laser in this Example 1. The vertical axis shows frequencies around the approximate oscillation frequency $193 \times 10^{12}$(Hz) indicated by the equation (2). Measurements demonstrated that oscillation frequencies continuously vary with the temperature, thus confirming the suppression of mode hopping in the range of from –15° C. to 65° C. In this case, the frequency fluctuation was 0.1% or less. The threshold current for oscillation was 150 mA.

Example 2

Figure 5:
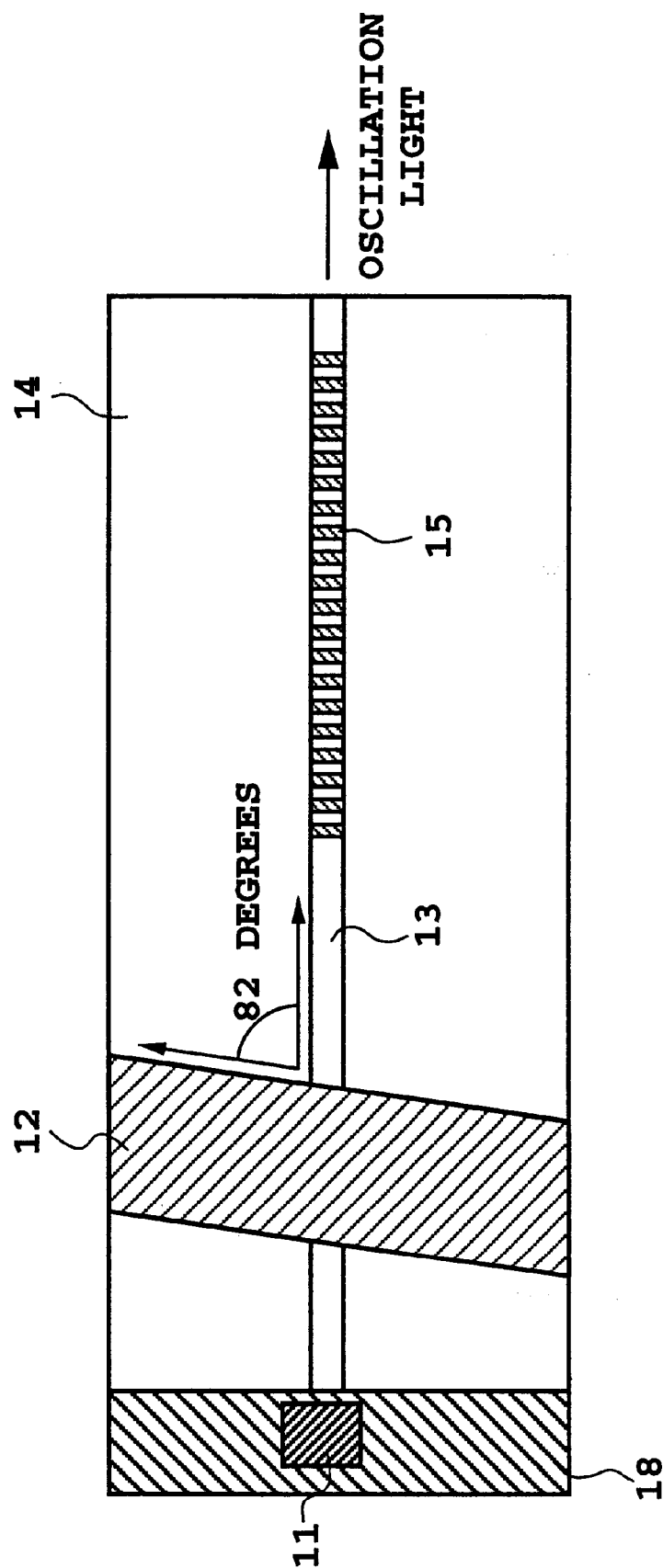
FIG. 5 is a schematic plan view showing a structure according to a second embodiment of the present invention.

FIG. 5 is a plan view of a frequency stabilized laser of Example 2. The differerence from Example 1 is that the angle of the groove to the silica-based waveguide is 82 degrees. The other constitution and the fabrication process are the same as for the frequency stabilized laser of Example 1.

The reason for setting the angle between the groove and the silica-based waveguide at 82 degrees is as follows: When a temperature coefficient adjusting material greatly different in refractive index from the silica-based waveguide is used, reflection of light at the interface between the silica-based waveguide and the temperature coefficient adjusting material is marked because of the big difference in refractive index. If a large quantity of reflected light returns to the semiconductor LD, oscillation of the frequency stabilized laser becomes unstable. Depending on the type of the temperature coefficient adjusting material, therefore, there may be difficulty in suppressing mode hopping in response to a temperature change. When the angle of the groove to the silica-based waveguide is set at 82 degrees, reflected light escapes from the core to the claddings of the waveguide, and does not return to the LD, thus stabilizing the oscillation of the frequency stabilized laser. That is, even a temperature coefficient adjusting material having a refractive index greatly different from that of the silica-based waveguide can be used in suppressing the mode hopping of the frequency stabilized laser.

Figure 6:
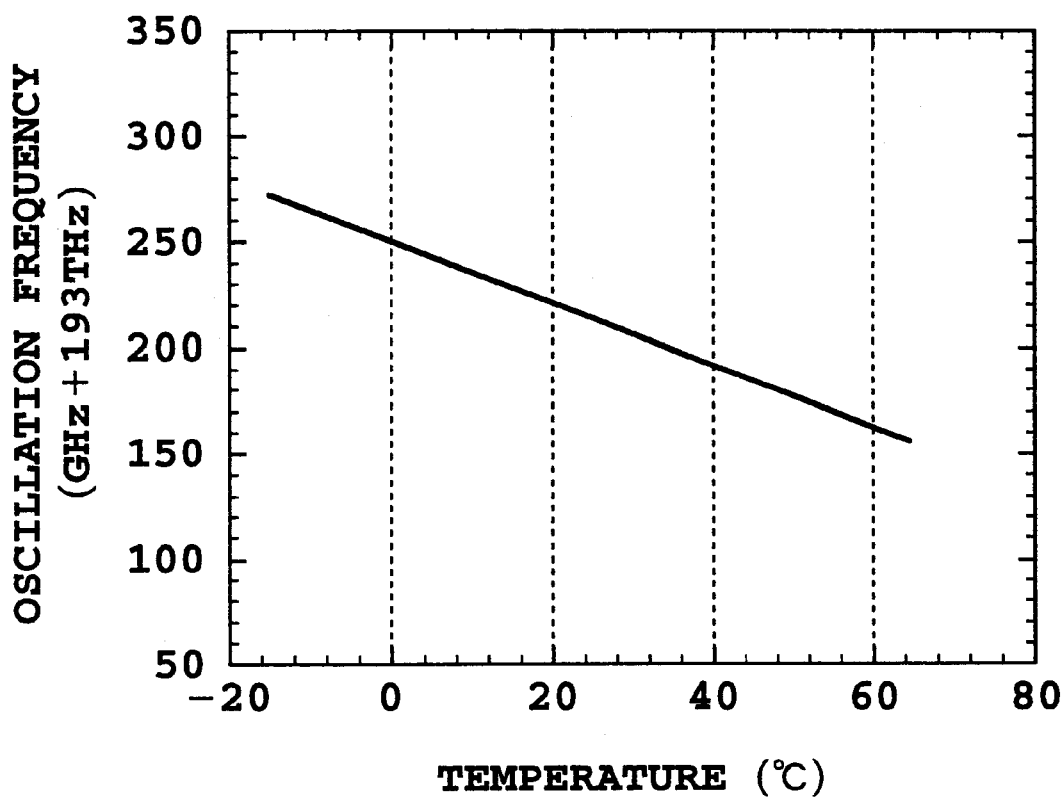
FIG. 6 is a graph showing the results of measurement of the temperature dependence of oscillation frequencies in the second embodiment.

FIG. 6 shows the results of measurement of the temperature dependence of the oscillation frequencies of the frequency stabilized laser in this Example 2. As in Example 1, suppression of mode hopping was confirmed in the range of from –15° C. to 60° C. The threshold current for oscillation was 150 mA.

Example 3

Figure 7:
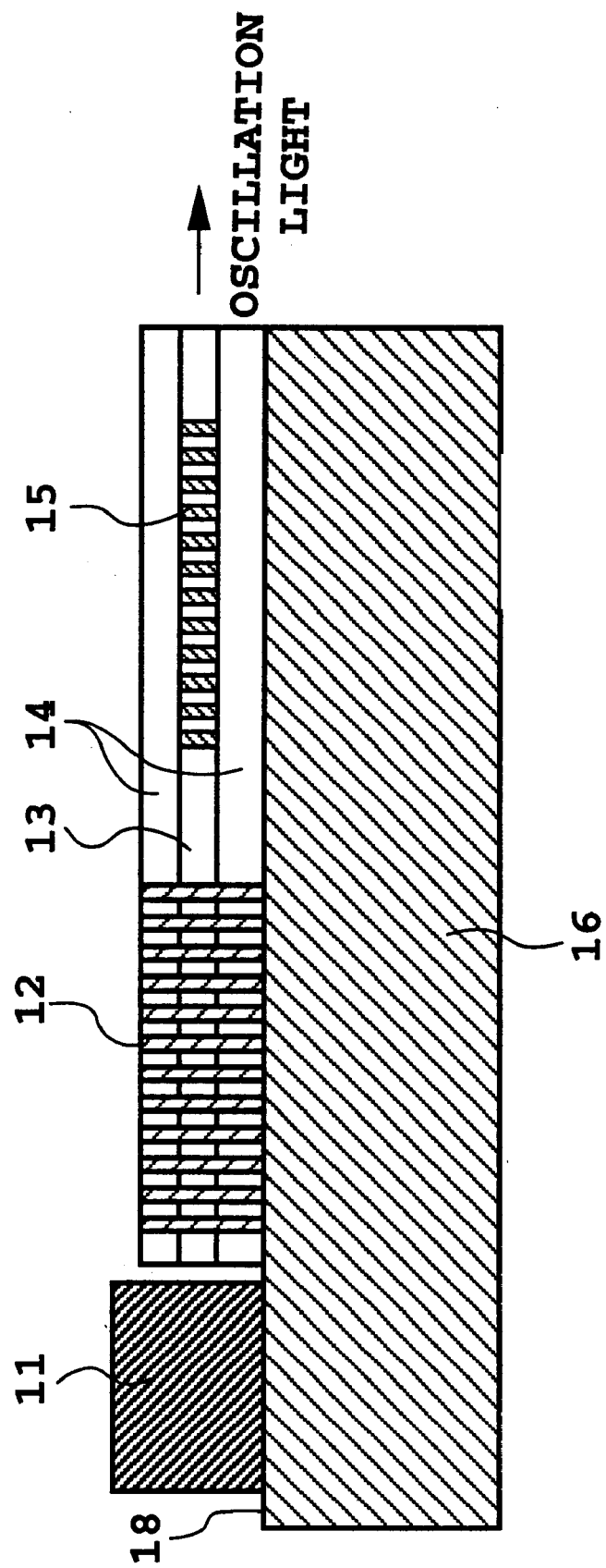
FIG. 7 is a schematic sectional view showing a structure according to a third embodiment of the present invention.
Figure 8:
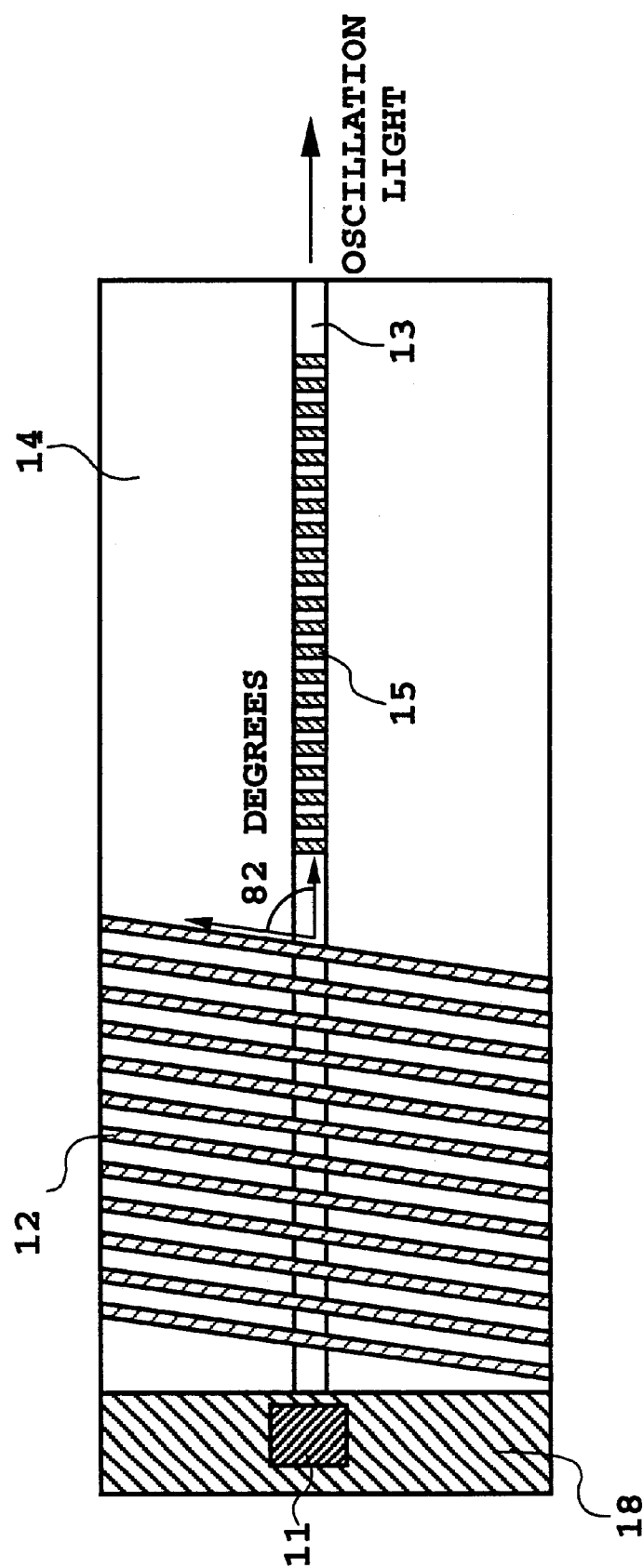
FIG. 8 is a schematic plan view showing the structure of the third embodiment.

FIGS. 7 and 8 are a sectional view and a plan view of a frequency stabilized laser of Example 3, respectively. The differences from Example 2 are that this laser has a plurality of grooves, each groove being filled with a temperature coefficient adjusting material 12. In short, this laser is characterized in that the 300 μm groove is divided into a plurality of thin grooves. Concretely, a thin groove forming blade is used in fabricating grooves by a dicing saw, to prepare 12 grooves 25 μm in width. The other constitution and the fabrication process are the same as for the frequency stabilized laser of Example 2. Measurements confirmed suppression of mode hopping in the range of from –15° C. to 65 0° C. The threshold current was 10 mA which was more than an order of magnitude less than in Example 2.

The reason why the formation of the plural thin grooves resulted in a low threshold current is as follows:

Assume that a portion cleared of either the upper cladding and the core, or the upper cladding, the core and the lower cladding, namely, a groove crossing the core, is formed in the waveguide, and a material different from the material constituting the waveguide is filled into this groove. In this case, light passing through the waveguide varies in guided modes. Thus, a transmission loss arises compared with the waveguide without any groove. This loss rapidly increases, particularly as the total length of the groove in the direction of the waveguide becomes larger. In comparison with filling all the temperature coefficient adjusting material into a single thick groove, filling the temperature coefficient adjusting material into a plurality of thin grooves reduces the loss of transmitted light. Hence, the use of the latter measure, as contrast with the former measure, decreases the loss in the laser cavity, thus decreasing the threshold current of the frequency stabilized laser.

Example 4

Figure 9:
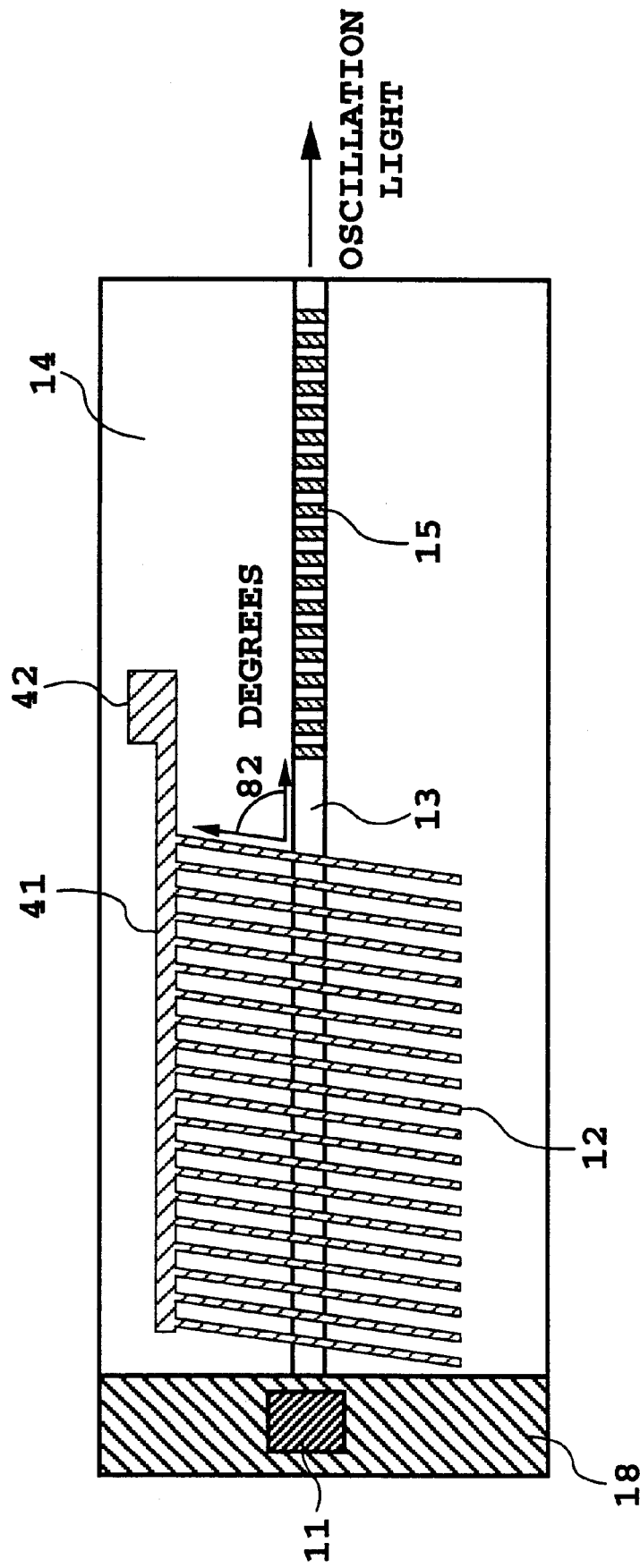
FIG. 9 is a schematic plan view showing a structure according to a fourth embodiment of the present invention.

FIG. 9 is a plan view of a frequency stabilized laser of Example 4. The differences from the constitution of Example 3 are characterized in that this laser has a groove 41 connecting a plurality of grooves together, and a liquid reservoir 42 is connected to the connecting groove 41. Thus, the difference from Example 3 in the fabrication process is that Example 3 performs grooving by means of a dicing saw, while Example 4 performs grooving by photolithography and reactive ion etching to form both of the connecting groove and the liquid reservoir simultaneously with the formation of the plurality of grooves.

An advantage of fabricating grooves by reactive ion etching is a high degree of freedom of groove designing. Another advantage of reactive ion etching is the ability to form grooves with a smaller width than does the use of a dicing saw. With fabricating grooves using a dicing saw, a width of 22 to 25 $\mu$m is the limit. When reactive ion etching is used, the minimum width of a groove that can be formed with good reproducibility is 15 $\mu$m. As described in Example 3, too, when a temperature coefficient adjusting material is to be installed in grooves whose total length in the direction of the waveguide (the sum of their widths) is the same, filing of the temperature coefficient adjusting material into thinner and more grooves can make the transmission loss smaller. When grooves having widths totaling 300 $\mu$m are formed, the formation of twenty 15 $\mu$m wide grooves involves less loss than the formation of twelve 25 $\mu$m wide grooves. Thus, the formation of grooves by reactive ion etching, compared with grooving by a dicing saw, reduces the loss in the laser cavity of the frequency stabilized laser, and decreases the threshold current.

In the fabrication process, a pattern of grooves is produced simultaneously with the creation of the Si terrace. The entire fabrication process is shown in FIGS. 10–10G.

An Si etching step (FIG. 10A) and a silica-based waveguide deposition step (FIG. 10B) are the same as the steps in FIGS. 3A and 3B. In an Si terrace/groove formation step (FIG. 10C), a design for creating twenty 15 $\mu$m grooves as fine grooves, and a pattern design for forming a connecting groove and a liquid reservoir are added to a photomask for forming an Si terrace 18. By so doing, twenty 15 $\mu$m grooves, a connecting groove and a liquid reservoir are formed simultaneously with the preparation of the Si terrace. The use of this method, compared with fabricating grooves by a dicing saw, can increase the efficiency of fabrication because of the absence of a step of fabricating grooves. After a solder pattern formation step (FIG. 10D), preparation of grating (FIG. 10E), installation of LD (FIG. 10F), and filling of a temperature coefficient adjusting material (FIG. 10G) are carried out in practically the same manner as in FIGS. 3A–3H).

Silicone to be filled into the grooves is a liquid. Thus, its filling into the liquid reservoir 42 can cause a suitable amount of the silicone to be filled into the respective grooves at a stroke. This liquid reservoir can be applied to any temperature coefficient adjusting material that is in liquid form when injected into the grooves. In Example 3 without a liquid reservoir, when silicone is filled, the silicone may overflow, making it difficult to adjust the amount of filling. In Example 4, by contrast, a suitable amount of the silicone can be filled at a stroke by use of the liquid reservoir, thus making the filling step efficient.

The temperature dependence of the oscillation frequencies of the resulting frequency stabilized laser was measured. The measurements confirmed the suppression of mode hopping in the range of from −15° C. to +65° C. in Example 4 as in Example 3. The threshold current was 8.0 mA, showing a further decrease in the threshold current in comparison with Example 3. This is an effect resulting from the formation of thinner, more grooves by reactive ion etching.

In Examples 1, 2, 3 and 4, silicone was used as the temperature coefficient adjusting material. However, the present invention is not restricted thereto, as long as the refractive index temperature coefficient dn/dT of the material used is opposite in sign to the refractive index temperature coefficient of the semiconductor LD. The magnitude (absolute value) of this parameter is preferably $1\times10^{-4}$ or more. Materials which fulfill these requirements include low molecular weight materials, high molecular weight materials, materials polymerized from low molecular weight materials by crosslinking, and mixtures of low molecular weight materials and high molecular weight materials. Most organic low molecular weight materials have refractive index temperature coefficients whose magnitude satisfies the requirement, and they can be used to the frequency stabilized laser of the present invention. Examples are aromatic compounds such as benzene and toluene, cyclic hydrocarbon compounds such as cyclohexane, straight-chain hydrocarbon compounds such as isooctane, n-hexane, n-octane, n-decane and n-hexadecane, chlorides such as carbon tetrachloride, sulfides such as carbon disulfide, and ketones such as methyl ethyl ketone. Most high molecular weight materials also have the absolute value of dn/dT of $1\times10^{-4}$ or more, and thus can be used. Examples are polysiloxane and a crosslinked product of polysiloxane. Other examples are polyolefins such as polyethylene, polypropylene and polybutylene; polydienes such as polybutadiene and natural rubber; vinyl polymers such as polystyrene, polyvinyl acetate, polymethyl vinyl ether, polyacrylic acid, polymethyl acrylate, polymethacrylic acid, polymethyl methacrylate, polybutyl methacrylate, polyhexyl methacrylate, and polydodecyl methacrylate; straight-chain olefin-derived polyethers, polyphenylene oxide (PPO), and copolymers and blends thereof; polyethers such as polyether sulfone (PES) incorporating an ether group and a sulfonate group, polyether ketone (PEK) incorporating an ether group and a carbonyl group, and polyphenylene sulfide (PPS) or polysufone (PSO) having a thioether group, and copolymers and blends thereof; polyolefins having at least one substituent, such as an OH group, a thiol group, a carbonyl group or a halogen group, at an end thereof, e.g., HO—(C—C—C—C—)$_n$—(C—C—C—C—)$_m$—OH; polyoxides such as polyethylene oxide and polypropylene oxide; polybutyl isocyanate; and polyvinylidene fluoride. Further examples include crosslinked polymers prepared from low molecular oligomers, such as epoxy resins, and curing agents. Actually, these materials are used alone, or as a mixture of two or more in order to bring the refractive index temperature coefficient into agreement. When any of the above materials is used as the temperature coefficient adjusting material, the length $L_m$ of the area to be filled with the material is designed by the method described in Example 1 by using the values of the refractive index and refractive index temperature coefficient of the temperature coefficient adjusting material.

In Examples 2, 3 and 4 of the present invention, external feedback of reflected light was decreased by setting the angle between the groove and the waveguide at 82 degrees. If this angle is 80 to 87 degrees, the same effect will be obtained.

In Examples 1 and 2, a 300 µm single groove was formed. In Example 3, twelve 25 µm wide grooves were formed to make the total groove length 300 µm. In Example 4, twenty 15 µm wide grooves were formed for the same purpose. The spacing and number of the grooves are not restricted thereto. If a plurality of grooves each 15 to 50 µm wide are formed such that their total length is 300±50 µm including a formation error, the effect of suppressing mode hopping is obtained as in Examples 1, 2, 3 and 4.

In Examples 1 to 4, a single frequency stabilized laser has been described, but the present invention is not restricted to a single frequency stabilized laser. The constitution of the present invention is also effective for a laser comprising a plurality of frequency stabilized lasers integrated on the same substrate. Concrete examples will be offered below.

Figure 11:
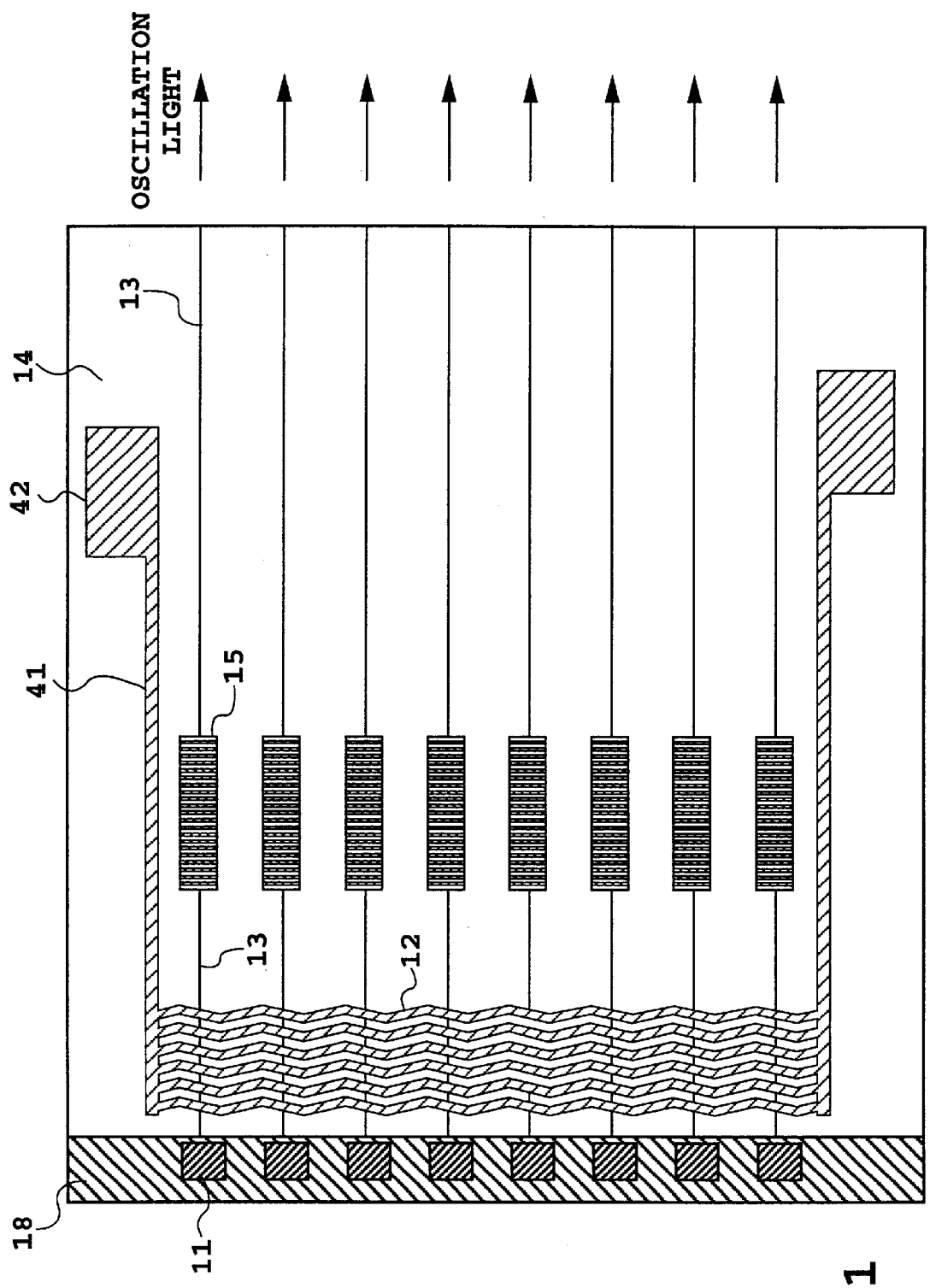
FIG. 11 is a schematic plan view showing a laser array produced by integrating the embodiments of the present invention.

(1) The constitution of the present invention is also effective in a laser array produced by integrating a plurality of frequency stabilized lasers. FIG. 11 is a schematic plan view of a laser array produced by integrating 8 of the frequency stabilized lasers of the present invention. In this example, the angle at which a plurality of grooves cross the waveguides of the respective frequency stabilized lasers is set at 82 degrees. Such a structure can be produced by photolithography and reactive ion etching as in Example 4. The number of outputs of the laser array is not limited to 8, as long as it is a plural number.

Figure 12:
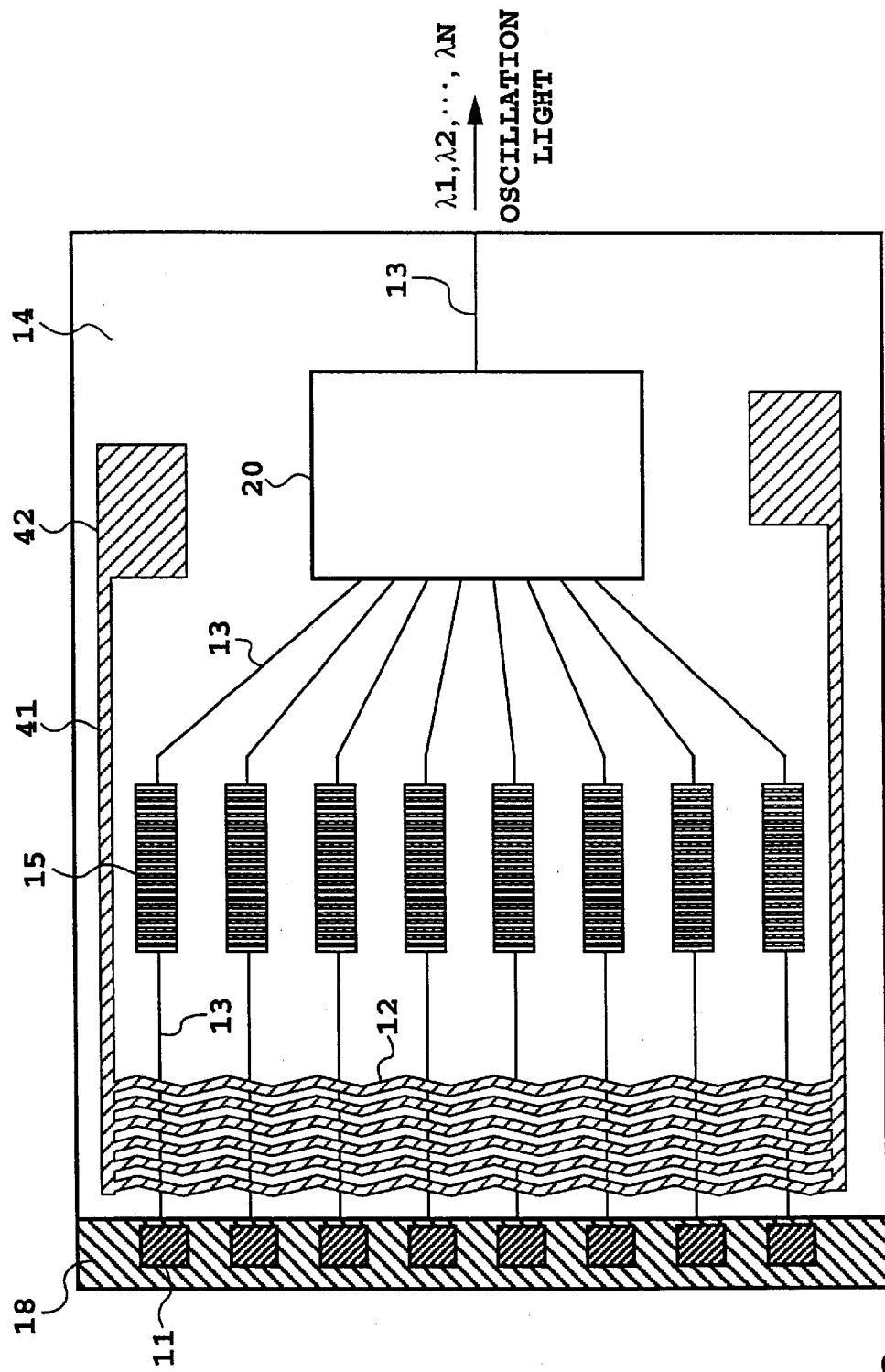
FIG. 12 is a schematic plan view showing a multiwavelength laser produced by integrating the embodiments of the present invention.
Figure 13:
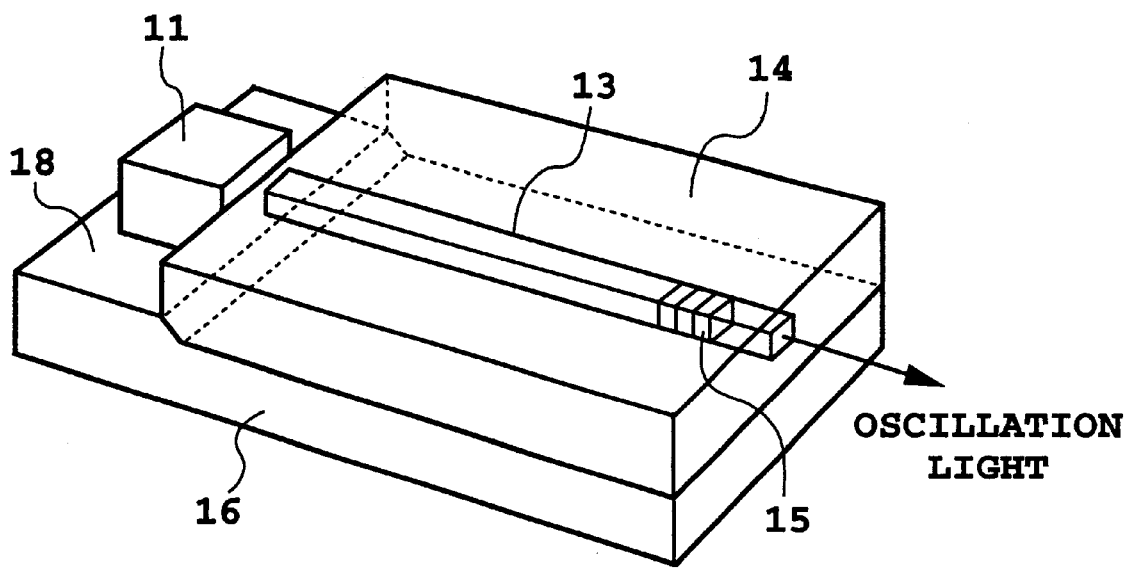
FIG. 13 is a schematic perspective view of a conventional frequency stabilized laser using a grating.
Figure 14:
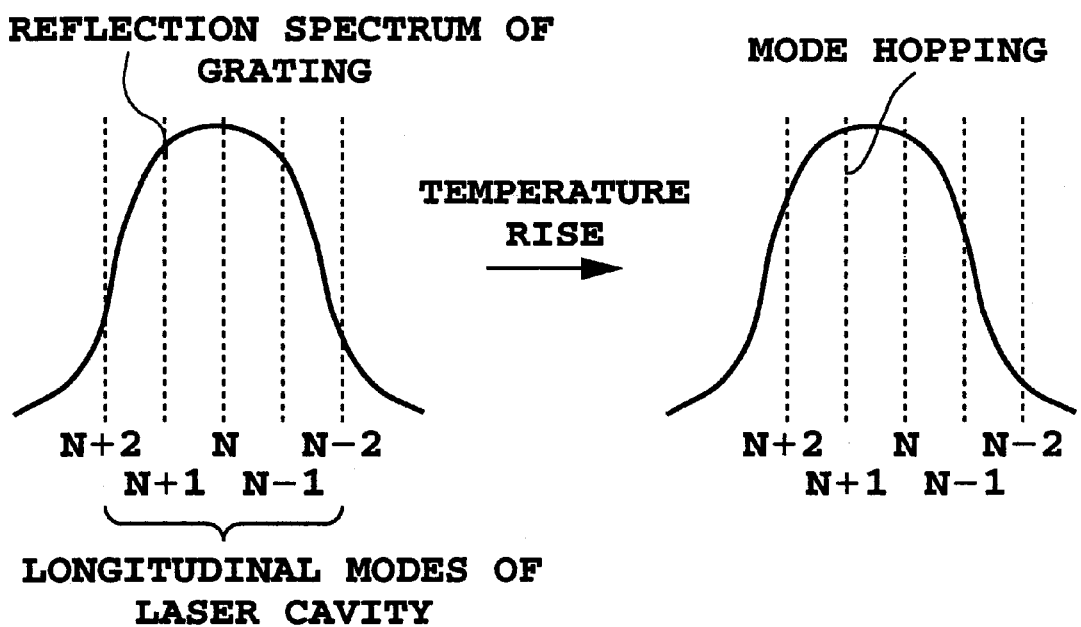
FIG. 14 is a view illustrating mode hopping due to a temperature change in a conventional frequency stabilized laser using a grating.

(2) The present invention is also effective for a multiwavelength laser (wavelengths $\lambda_1, \lambda_2, \ldots \lambda_n$) which has the above laser array structure comprising the integrated frequency stabilized lasers, which has the reflection center frequencies (or wavelengths) of the respective gratings controlled, and which includes an arrayed waveguide grating type 1×N wavelength multiplexer/demultiplexer or 1×N coupler. FIG. 12 is a schematic plan view of such a multiwavelength laser where the frequency stabilized lasers of the present invention are integrated. The reference numeral 20 signifies an arrayed waveguide grating type 1×N wavelength multiplexer/demultiplexer or 1×N coupler. In this example, two connecting grooves and two liquid reservoirs are provided, and the angle at which a plurality of grooves cross the waveguides of the respective frequency stabilized lasers is set at 82 degrees. This example shows 8 to be the number of the wavelengths of the multiwavelength laser. However, this number is not limited to 8, as long as it is a plural number. Furthermore, wavelengths are determined at the same time that frequencies are determined. Thus, frequency stabilization or control and wavelength stabilization or control can be used in the same sense. In short, a frequency stabilized laser and a wavelength stabilized laser can be used with the same meaning.

(3) The present invention is also effective for the above multiwavelength laser having the arrayed waveguide grating type 1×N wavelength multiplexer/demultiplexer or 1×N coupler further integrated to the laser array, the multiwavelength laser being characterized in that, as proposed in Japanese Laid-Open Patent Application No. 10-242591 (1998), the core width of the waveguide at the site of formation of the grating differs depending on the waveguide, or the angle of the grating vector to the optical axis of the waveguide at the site of formation of the grating differs depending on the waveguide, in order to prepare gratings with different reflection center wavelengths at a stroke.

(4) The present invention is also effective for the above multiwavelength laser having the arrayed waveguide grating type 1×N wavelength multiplexer/demultiplexer or 1×N coupler integrated to the laser array where a plurality of frequency stabilized lasers are integrated, the multiwavelength laser being characterized in that a semiconductor optical amplifier is included for amplifying the multiplexed output light.

(5) The present invention is also effective for the above multiwavelength laser having the arrayed waveguide grating type 1×N wavelength multiplexer/demultiplexer or 1×N coupler integrated to the laser array where a plurality of frequency stabilized lasers are integrated, or the same multiwavelength laser further including a semiconductor optical amplifier, the multiwavelength laser being characterized in that EA modulators for fast modulation of respective wavelength outputs are integrated to the semiconductor LD's.

(6) The present invention is also effective for the above multiwavelength laser having the arrayed waveguide grating type 1×N wavelength multiplexer/demultiplexer or 1×N coupler integrated to the laser array where a plurality of frequency stabilized lasers are integrated, or the same multiwavelength laser further including a semiconductor optical amplifier, the multiwavelength laser being characterized in that $LiNbO_3$ modulators for fast modulation of respective wavelength outputs are further included.

In Examples 1 to 4, the semiconductor LD installed on the substrate was a semiconductor LD with an oscillation wavelength of 1.55 µm. Generally, however, the use of a semiconductor LD with a different oscillation wavelength would, needless to say, enable mode hopping to be suppressed, by appropriately designing the size of the optical waveguide or the total length of the region where the temperature coefficient adjusting material is installed.

In realizing a device bearing a semiconductor LD, it has been common practice to seal the LD with resin, to avoid its exposure to moisture, thereby ensuring long-term reliability. If the temperature coefficient adjusting material mentioned in Examples 1 to 4 concurrently serves as a resin sealing material, this temperature coefficient adjusting material is filled at a stroke into the entire region covering from the groove to be filled with the temperature coefficient adjusting material to the semiconductor LD, whereby it becomes possible to suppress mode hopping and ensure the reliability of the semiconductor LD at the same time. In this case, however, the temperature coefficient adjusting material is also filled into a tiny gap between the semiconductor LD and the silica-based waveguide. Thus, it is necessary to design the antireflection film at the front end face of the semiconductor LD in consideration of the refractive index of the temperature coefficient adjusting material. With such a constitution, if the refractive index of the temperature coefficient adjusting material is equal to the refractive index of the silica-based waveguide n=1.45, no reflection of light occurs between the end face of the silica-based waveguide opposed to the semiconductor LD and the temperature coefficient adjusting material. Hence, the semiconductor LD-opposed end face of the silica-based waveguide may have a core-adjoining portion perpendicular to the optical axis of the core.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A frequency stabilized laser comprising:

a substrate;

a semiconductor laser diode located on said substrate, said laser diode having a refractive index temperature coefficient of a first sign;

an optical waveguide spaced from said semiconductor laser diode, said optical wave guide being deposited on said substrate;

an optically induced grating formed in said optical waveguide; and a temperature coefficient adjusting material having a refractive index temperature coefficient of a second sign opposite to the first sign, said material being located at a position within a portion of said optical waveguide between said semiconductor laser diode and said optically induced grating.

2. The frequency stabilized laser of claim 1, wherein said optical waveguide has upper and lower claddings and a core interposed between said claddings, and wherein said temperature coefficient adjusting material replaces the upper cladding and the core of said optical waveguide at the position between the semiconductor laser diode and the optically induced grating.

3. The frequency stabilized laser of claim 1, wherein said optical waveguide has upper and lower claddings and a core interposed between said claddings, and wherein said temperature coefficient adjusting material replaces the upper cladding, the lower cladding and the core of said optical waveguide at the position between the semiconductor laser diode and the optically induced grating.

4. The frequency stabilized laser of claim 2 or 3, wherein the optical waveguide is composed of a silica glass.

5. The frequency stabilized laser of claim 2 or 3, wherein the portion of said optical waveguide replaced by said temperature coefficient adjusting material crosses the waveguide at an angle of 80 to 90 degrees.

6. The frequency stabilized laser of claim 4, wherein the portion of said optical waveguide replaced by said temperature coefficient adjusting material crosses the waveguide at an angle of 80 to 90 degrees.

7. The frequency stabilized laser of claim 4, wherein the portion of said optical waveguide replaced by said temperature coefficient adjusting material crosses the waveguide at an angle of 80 to 87 degrees.

8. The frequency stabilized laser of claim 4, wherein the portion of said optical waveguide replaced by said temperature coefficient adjusting material crosses the waveguide at an angle of 82 degrees.

9. The frequency stabilized laser of claim 4, wherein the portion of said optical waveguide replaced by said temperature coefficient adjusting material is composed of a plurality of grooves.

10. The frequency stabilized laser of claim 7 having a groove connecting the plurality of grooves, and a liquid reservoir connected to the plurality of connecting grooves.

11. The frequency stabilized laser of any one of claims 1 to 3, wherein the absolute value of the refractive index temperature coefficient of the temperature coefficient adjusting material is at least $1 \times 10^{-4}$ (1/K).

12. The frequency stabilized laser of claim 4, wherein the absolute value of the refractive index temperature coefficient of the temperature coefficient adjusting material is at least $1 \times 10^{-4}$ (1/K).

13. The frequency stabilized laser of claim 5, wherein the absolute value of the refractive index temperature coefficient of the temperature coefficient adjusting material is at least $1 \times 10^{-4}$ (1/K).

* * * * *